United States Patent [19]

Murotani

[11] Patent Number: 5,159,215

[45] Date of Patent: Oct. 27, 1992

[54] DECODER CIRCUIT

[75] Inventor: Tatsunori Murotani, Tokyo, Japan

[73] Assignee: NEC Corporation, Tokyo, Japan

[21] Appl. No.: 660,818

[22] Filed: Feb. 26, 1991

[30] Foreign Application Priority Data

Feb. 26, 1990 [JP] Japan .................................. 2-45066

[51] Int. Cl.[5] .................... H03K 19/094; G11C 80/00
[52] U.S. Cl. .............................. 307/449; 307/296.8;
365/189.09; 365/230.06
[58] Field of Search ...................... 307/449, 303, 296.8;
365/189.09, 230.06, 181

[56] References Cited

U.S. PATENT DOCUMENTS

| | | | |
|---|---|---|---|
| 4,233,672 | 11/1980 | Suzuki et al. | 365/181 |
| 4,618,784 | 10/1986 | Chappell et al. | 365/230.06 |
| 4,760,560 | 7/1988 | Arlizumi | 365/189.09 |
| 4,802,123 | 1/1989 | Tobita | 365/189.09 |
| 4,843,261 | 6/1989 | Chappell et al. | 365/230.06 |
| 4,862,415 | 8/1989 | Nakano | 365/189.09 |
| 4,918,663 | 4/1990 | Remmington et al. | 365/226 |
| 4,982,372 | 1/1991 | Matsuo | 365/230.06 |
| 5,051,959 | 9/1991 | Nakano et al. | 365/230.06 |

FOREIGN PATENT DOCUMENTS 0222472 5/1987 European Pat. Off. .
0300184 1/1989 European Pat. Off. .

*Primary Examiner*—Edward P. Westin
*Assistant Examiner*—Richard Roseen
*Attorney, Agent, or Firm*—Sughrue, Mion, Zinn, Macpeak & Seas

[57] ABSTRACT

A decoder circuit comprises a P type substrate in which an N well is formed, a plurality of P channel word line drive transistors each having a gate supplied with a signal having a level corresponding to an address signal and a source-drain connected between a word line and an input terminal of a signal driving the word line and the N well is biased with a biasing signal different from said word line drive signal. Gate insulating films of the word line drive transisters are not subjected to breakdown by a high voltage application thereto. Further, since there is no extra load applied to the clock signal, it is possible to make the word line drive at high speed.

21 Claims, 6 Drawing Sheets

DECODER CIRCUIT

BACKGROUND OF THE INVENTION

1. Field of the Invention

The present invention relates to a decoder circuit and, in particular, to a structure of a decoder circuit for use to drive word lines of a dynamic randon access memory (DRAM).

2. Description of the Prior Art

It has been known that, in order to increase integration of semiconductor memory, size of semiconductor element tends to be further minimized. Currently, a memory cell of a DRAM is mainly of one transistor-one capacitor type and, in order to reliably write a potential with respect to a storing capacity of the memory cell, it is necessary to supply a write voltage high enough. To this end, word lines connected to gate transistors forming the memory cell must be driven with a potential which is higher than a threshold voltage of this gate transistor. In order to realize this requirement, a decoder circuit for selecting and driving an arbitrary word line is used.

A conventional decoder circuit can be composed generally of a logic circuit responsive to input address signals to provide a signal of a predetermined level and a word line drive transistor whose conduction is controlled by an output of the logic circuit. The word line drive transistor has one of a source and a drain connected to an input terminal of a clock signal for writing, the other connected to a word line and a gate connected to an output of the logic circuit.

In general, the word line drive transistor is an N channel transistor. Therefore, in order to drive the word line with a clock signal, the word line drive transistor must be made conductive by supplying a high level voltage to its gate. For example, when a 5 volts voltage is written in a memory cell using a usual 5 volts power source, the word line voltage must be in the order of 7 volts because a threshold voltage of the gate transistor of the memory cell must be compensated for. Therefore, the clock signal voltage to be supplied to the word line must be as high as 7 volts and thus in order to make the word line drive transistor connected to the word line conductive, a voltage as high as in the order of 9 volts is applied to the gate by means of a bootstrap circuit.

In the current state of art in which thickness of gate oxide film of a transistor is made thinner for high integration requirement and thus breakdown voltage of the element is lowered thereby, such high voltage may cause a degradation of reliability.

In order to solve this problem, it has been proposed to use a P channel transistor as a word line drive transistor so that a word line can be made high voltage without applying such high voltage to a gate of the transistor. That is, the P channel transistor can be made conductive by applying a low level voltage to its gate and, in the above mentioned example, the voltage to be applied to the gate can be reduced to 5 volts at least.

The P channel transistor, however, is formed in an N well provided in a P type substrate and therefore a PN junction is formed between the P type substrate and the N well. Therefore, in order to prevent the PN junction from being forward biased, the N well must be kept at high voltage during the transistor is conductive. As a voltage source for making the N well high voltage, a write clock signal has been used conventionally.

As mentioned above, when a P channel transistor is used to avoid the use of high voltage at a gate thereof, a write clock signal must be applied to not only a word line but also an N well.

When an N channel transistor is used as a word line drive transistor, a load capacity of a clock signal for write includes mainly a capacity of a source of drain diffusion layer of respective transistor, while, when a P channel transistor is used therefor, a capacity of an N well diffusion layer is added thereto, causing a total load capacity of the write clock signal to be several times that for the case where the N channel transistor is used.

It is difficult to drive such large capacitive load at high speed. Therefore, a rate of the write clock signal is lowered necessarily and thus a rising speed of word line potential level is lowered.

SUMMARY OF THE INVENTION

An object of the present invention is, therefore, to provide a decoder circuit capable of controlling a word line drive without using high voltage signal and of driving the word line at high speed.

A decoder circuir according to the present invention comprises an N type well provided in a P type substrate, P channel word line drive transistors formed in the N type well each having a gate supplied with a signal having a level corresponding to an address signal and a source/drain path provided between a word line and an input terminal for a drive signal of this word line and biasing means for biasing the N type well with a biasing signal different from the word line drive signal.

BRIEF DESCRIPTION OF THE DRAWINGS

The above mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
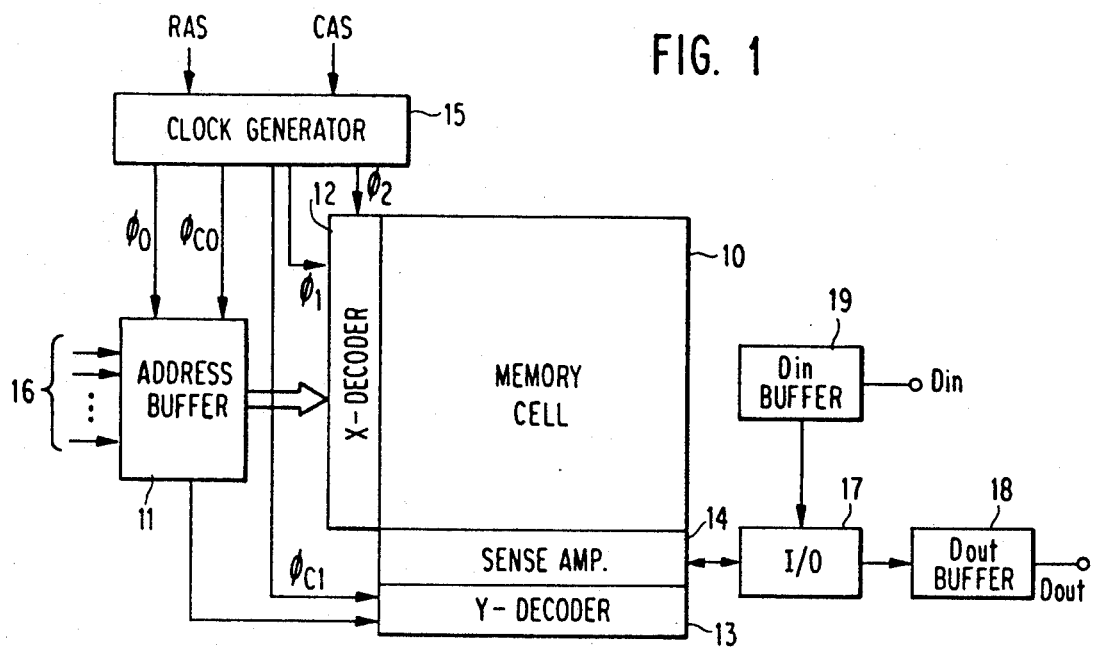
FIG. 1 is a block circuit diagram showing a construction of a semiconductor memory device including a decoder circuit according to the present invention.

A general construction and an operation of a semiconductor memory device including a decoder circuit according to the present invention will be described with reference to FIGS. 1 and 2. The semiconductor memory device in this embodiment may be a 16 Mbit DRAM. The semiconductor memory device is formed on a P type substrate whose memory cell is constituted with N channel MOS transistors and whose peripheral device is composed of a CMOS circuit. The memory cell 10 includes 16,777,216 cells arranged in 2,048 rows and 8,096 columns and each cell is constituted with an N channel MOS transistor and a capacitive cell, that is, the so-called "one transistor-one capacitor" type cell.

An X decoder 12 selects one of 2,048 word lines and a Y decoder selects one of 8,096 bit lines, according to address signals supplied thereto from an address buffer 11. These address signals are supplied in time shared manner from 12 address lines 16 to the address buffer 11.

When a row active RAS signal is inputted (see FIG. 2a), a clock generator 15 supplies a $\phi 0$ to the address buffer 11 (see FIG. 2b) and row addresses are supplied to the address buffer 11 externally (see FIG. 2c). A biasing signal $\phi 2$ (FIG. 2d or 2e) according to the present invention is supplied to the X decoder 12 and an N well in which word line drive transistors constituting the X decoder are formed is biased to a high voltage as to be described later. A row address signal is supplied from the address buffer 11 to the X decoder 12, a signal $\phi 1$ for driving the word line is supplied from the clock generator 15 to the X decoder 12 (see FIG. 2f) and the word line selected by the row address signal becomes high level (see FIG. 2g). A sense amplifier 14 senses and amplifies high level or low level of the bit line according to 0 or 1 stored in the memory cell connected to the selected word line (FIG. 2h).

When a column active CAS signal is inputted as shown in FIG. 2i, the clock generator 15 supplies $\phi c0$ to the address buffer 11 (FIG. 2j) and a column address is supplied to the Y decoder 13 (FIG. 2k). Then, a signal $\phi c1$ which drives a column select line for selecting bit line is supplied from the clock generator to the Y decoder 13 (FIG. 2l) and the selected column select line becomes high level (FIG. 2m).

With the above mentioned operations, a cell corresponding to an address inputted is connected to a bit line selected by the column select line.

For a read operation, an information of the selected cell is provided at an output terminal Dout of an output buffer 18 as a level of the selected bit line through an I/O selector 17, since the information corresponds to high or low level of the selected bit line. On the other hand, for a write operation, an input data at an input terminal Din of an input buffer 19 is passed through the I/O selector 17 to force the level of the selected bit line to high or low which is written in the cell.

After completion of the read or write operation, RAS and CAS signals become high level, i.e., non-active, and $\phi 0$, $\phi 1$, $\phi 2$ (in the case shown in FIG. 2e), $\phi C0$ and $\phi C1$ become low level sequentially, terminating one cycle of write or read operation for the semiconductor memory device.

For the write operation among these operations, there may be a case where a data which is opposite to the stored data must be written in the memory cell, such as when a low level data stored in the memory cell is to be rewritten to a high level data or vice versa. In such case, it must be assured that a potential is written in a capacitor of the memory cell reliably. In order to do so, the word line connected to the gate transistor constituting the memory cell must be driven with a potential sufficiently higher than the threshold voltage of the gate transistor at high speed. According to the present invention, this is achieved by modifying the X decoder. This will be described with reference to FIGS. 3 to 10.

Figure 2:
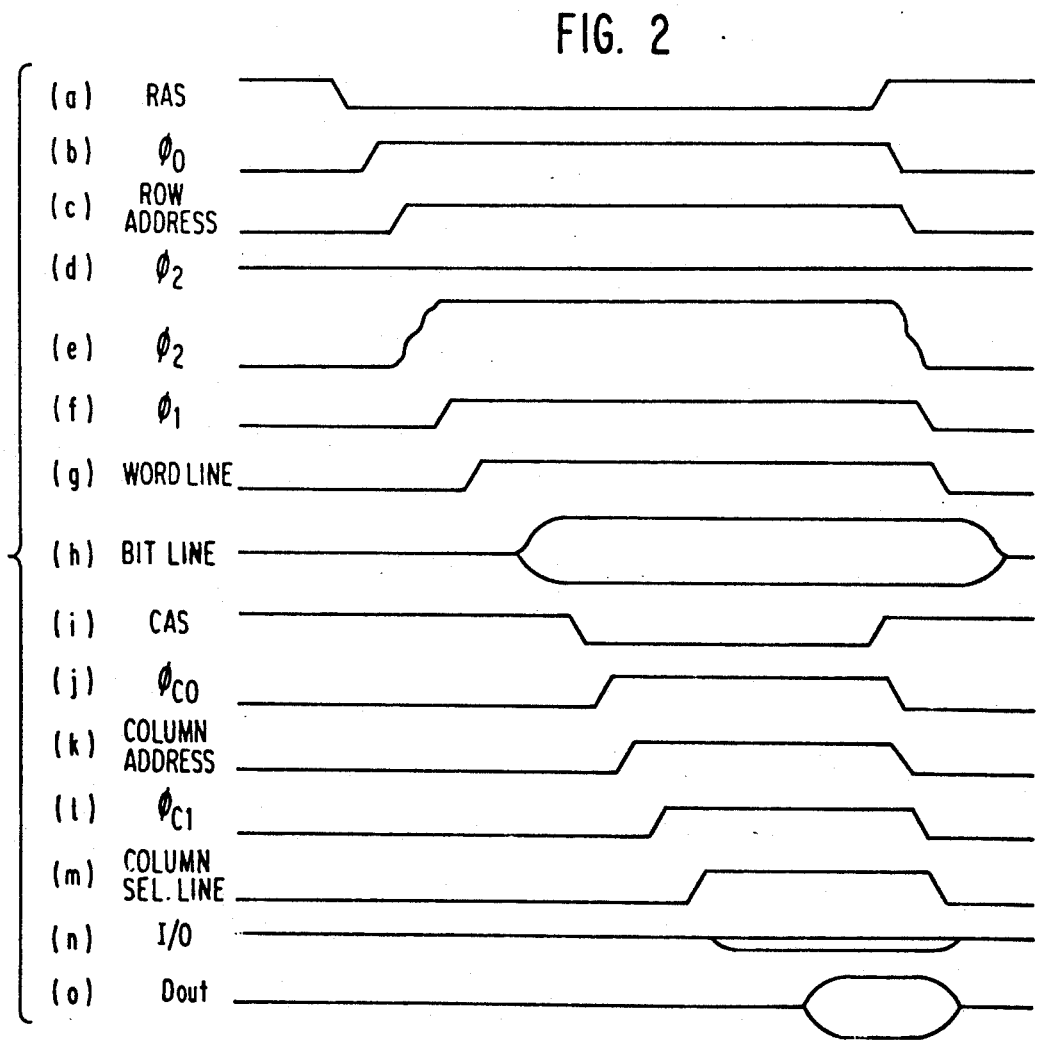
FIG. 2 is a timing chart explaining an operation of the semiconductor memory device shown in FIG. 1.
Figure 3:
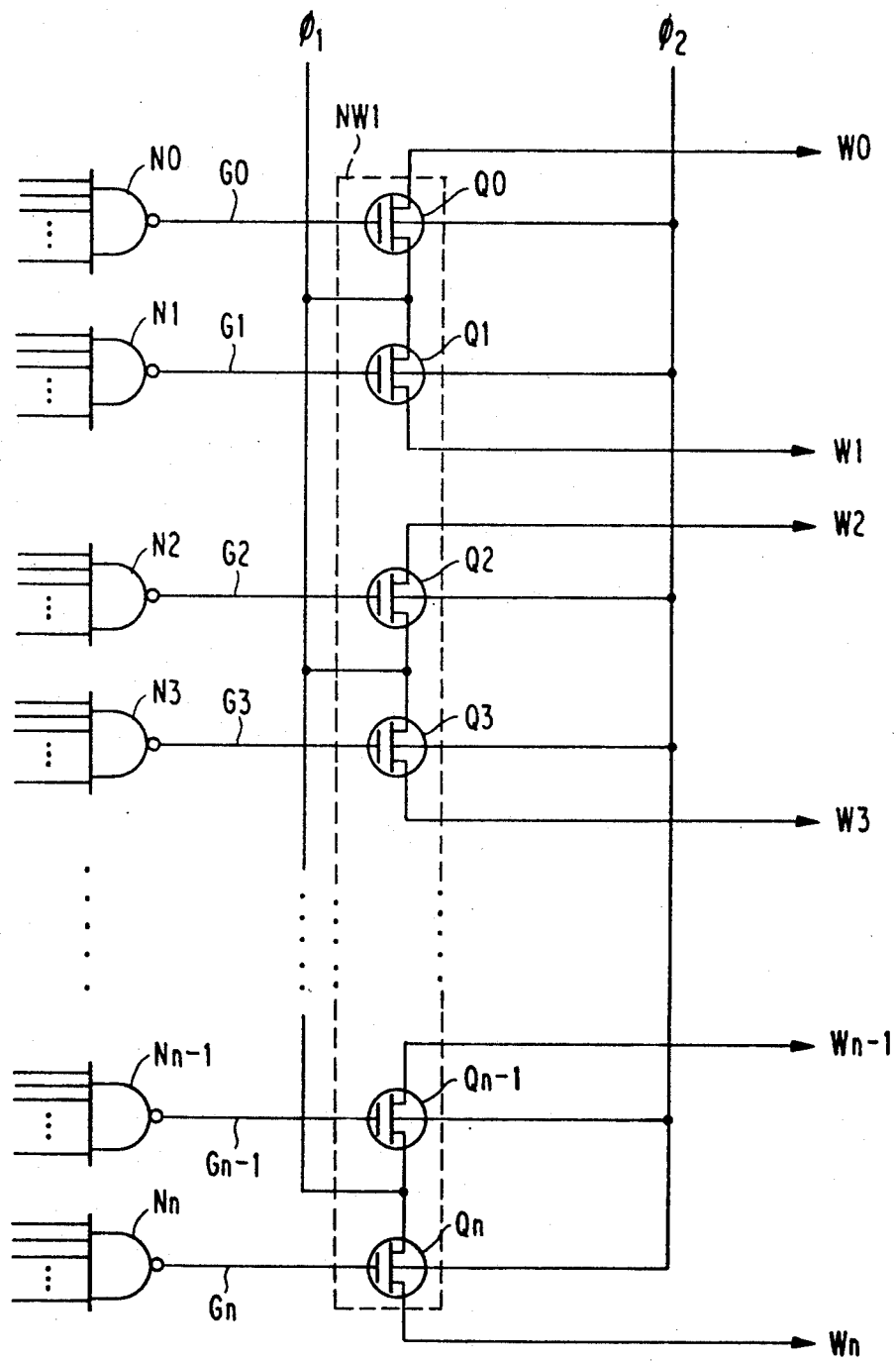
FIG. 3 is a circuit diagram showing an example of a decoder circuit of the present invention.

FIG. 3 is a circuit diagram of the X decoder shown in FIG. 1. The X decoder circuit comprises NAND circuits N0, N1, N2, ..., Nn each detecting row address supplied from the address buffer 11 (FIG. 1) and providing a low level signal upon coincidence and word line drive transistors Q0, Q1, Q2, ..., Qn−1, Qn each being controlled in conduction according to an output of the NAND circuit.

Each of the word line drive transistors Q0, Q1, ..., Qn is a P channel transistor having a source connected to a common input terminal for the clock signal $\phi 1$ for driving word line, a drain connected to different one of word lines W0, W1, ..., Wn and a gate supplied with different one of outputs G0, G1, ..., Gn of the NAND circuits N0, N1, ... Nn. Since the word line drive transistors are P channel transistors, in order to make it conductive to apply the $\phi 1$ to the word line, it is enough to supply a low level voltage (e.g., 0 V) to the gate of the word line drive transistor. Further, it is enough to apply a voltage (e.g., 5 V) to a gate of the word drive transistor to drive the latter to an off state, when not selected. Therefore, even when a high potential (e.g., 7 V) is applied in order to assure a writing, it is unnecessary to increase the gate voltage thereof, resulting in degradation of reliability due to such as breakdown of gate insulating film minimized.

$\phi 1$ is a clock signal for driving the word lines and for writing in the memory cells, which is supplied from a clock generator 15 (FIG. 1) after $\phi 0$ is supplied to the address buffer 11 (see FIGS. 2b and 2f). This $\phi 1$ is a high potential (e.g, 7 V) clock signal in order to reliably perform a writing.

Since the semiconductor memory device including this decoder circuit is formed on the P type substrate, each P channel transistor must be formed in an N well formed therein. In this embodiment, all of the word line drive transistors Q0, Q1, ... are formed in a single N well NW1.

As mentioned previously, when an N well is formed in a P type substrate, a PN junction is formed between the N well and the P type substrate. Therefore, in order to prevent the PN junction from being forward-biased, the high voltage must be applied to the N well during conduction of the transistor.

The inventors of this application have found that, as means for biasing the N well NW1 to high voltage state, another biasing signal $\phi 2$ should be applied to the N well, instead of the clock signal $\phi 1$ for driving the word line. With such construction, the load to be driven by the clock signal $\phi 1$ is reduced. Thus, the present invention makes the word line drive at higher speed possible, compared with the conventional circuit construction.

An example of a wiring pattern for the biasing signal $\phi 2$ will be described with reference to FIG. 4 which is a plan view of the word line drive transistors Q0 to Q4 of the decoder circuit shown in FIG. 3 and FIGS. 5a and 5b which are cross sections taken along respective lines X—X and Y—Y in FIG. 4. An N well NW1 is provided on a P type substrate 51 and the word line drive transistors Q0, Q1, . . . are formed in the N well.

Gate electrodes G0, G1, . . . of the transistors Q0, Q1, . . . to which signals are supplied from respective NAND circuits N0, N1, . . . (not shown) are of polysilicon arranged on the N type well NW1 through a gate oxide film 53. A clock signal $\phi 1$ on a wiring L$\phi 1$ is supplied to wirings SL0, SL1, . . . each of which extends between a pair of word line drive transistors perpendicularly from the wiring L$\phi 1$ and which constitute source electrodes of the word line drive transistors Q0, Q1. Thus, each source electrode is commonly used by two word line drive transistors (e.g., Q0 and Q1). The source electrodes SL0, SL1, . . . are connected through a plurality of contact holes to P type diffusion regions s0, s1, . . . forming a source region in the N well NW1.

On the other hand, the word line drive transistors Q0, Q1, . . . have their own drain electrodes, respectively. Therefore, the same number of drain electrodes DL0, DL1, . . . as that of the word line drive transistors are arranged. These drain electrodes are connected through a plurality of contact holes to P type diffusion regions d0. d1, . . . forming drain regions in the N well NW1, respectively. Further, the drain electrodes DL0, D11, . . . are connected through contact holes C0, C1, . . . to word lines W0, W1, . . . formed by a lower polysilicon layer. A signal $\phi 1$ on a wiring L$\phi 2$ is supplied to aluminum wirings BL0, BL1, . . . each of which extends between a pair of word line drive transistors perpendicularly from the wiring L$\phi 2$ and which are connected through a plurality of contact holes to N+ diffusion regions N0, N1, . . . in the N well NW1, respectively, to bias the N well to high voltage.

Figure 5A:
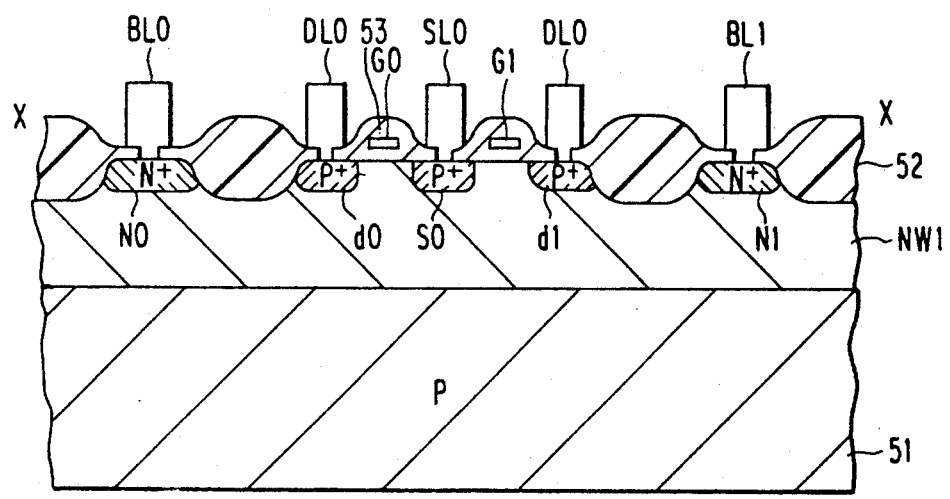
FIG. 5a is a cross section taken along a line X—X in FIG. 4.
Figure 5B:
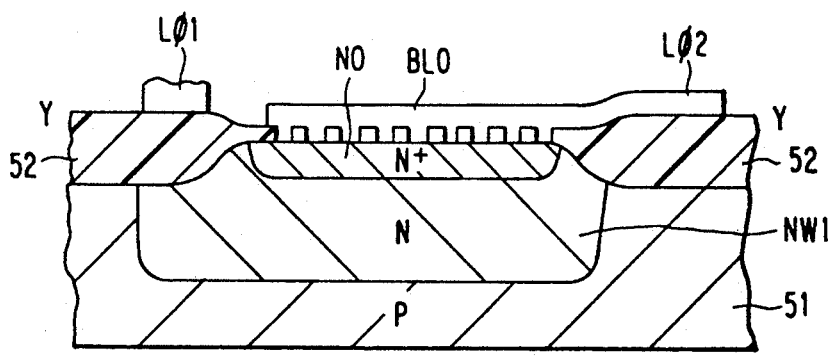
FIG. 5b is a cross section taken along a line Y—Y in FIG. 4.

Referring to FIGS. 5a and 5b, element forming regions are defined by a field oxide film 52 in the N well NW1 formed on the P type substrate 51. By diffusing P or N type impurity in these element forming regions, a P type diffusion region s0 which are used as common source for the word line drive transistors Q0, Q1, P type diffusion regions d0, d1 which are used as drains thereof and N type diffusion regions N0, N1 are formed. Gate electrodes G0, G1 of the word line drive transistors Q0, Q1 are disposed on the N well NW1 through the gate oxide film 53. The aluminum wiring layer SL0 to which the clock signal $\phi 1$ is supplied is connected through a contact hole to the P type diffusion region s0. Further, the aluminum layer DL0, DL1 connected to the word lines W0, W1 are connected through contact holes to the P type diffusion regions d0, d1. Further, the aluminum layers BL0, BL1 to which the biasing signal $\phi 2$ is supplied are connected through contact holes to the N type diffusion layers N0, N1 to bias the N type well NW1 to a high voltage.

Figure 4:
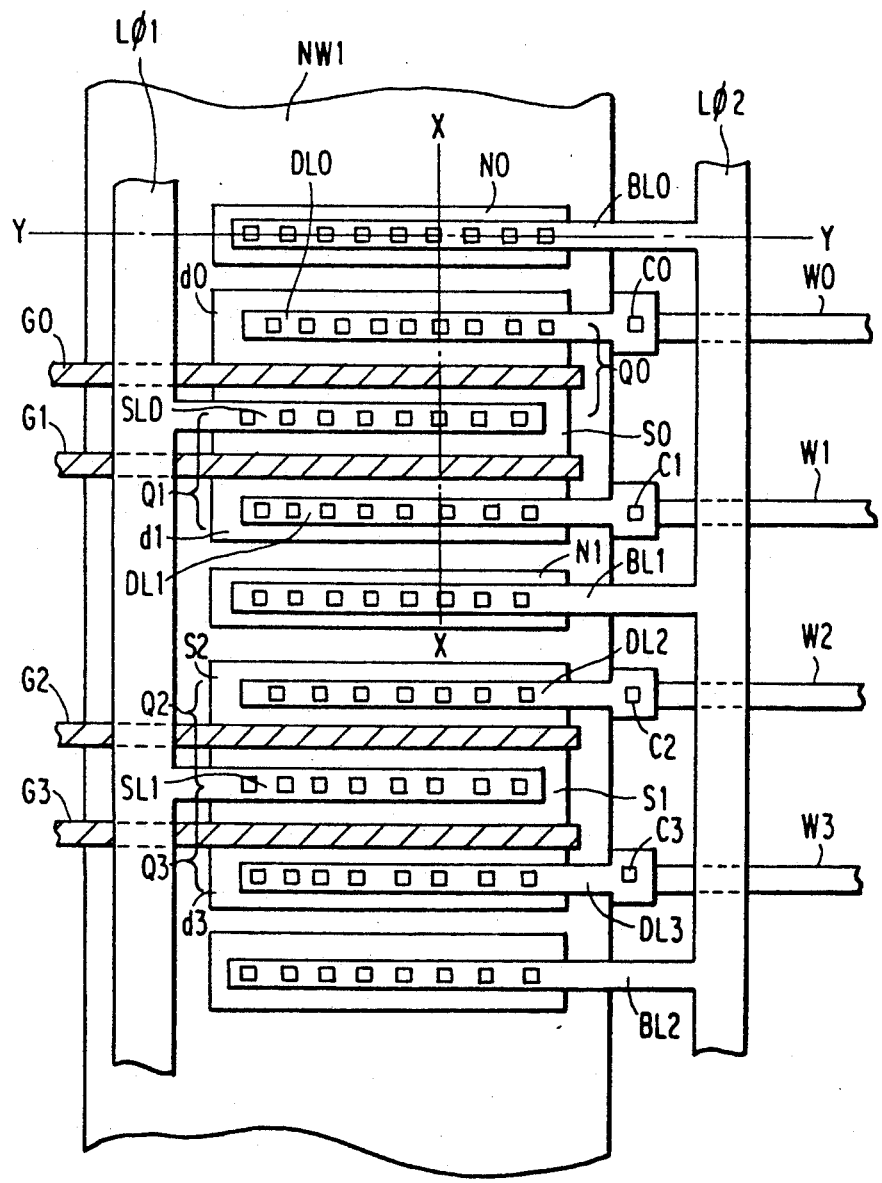
FIG. 4 is a plan view showing a wiring pattern of a portion of the decoder circuit shown in FIG. 3.

FIG. 4 shows an example of the wiring pattern to supply the bias signal $\phi 2$ for biasing the N type well NW1. However, any other pattern can be used instead of that shown in FIG. 4 with some modification of such as contacting scheme to the N type well. Examples of such pattern are shown in FIGS. 6 and 7 in which the pattern of the word line drive transistors is the same as that shown in FIG. 4 and so details thereof is omitted.

Figure 6:
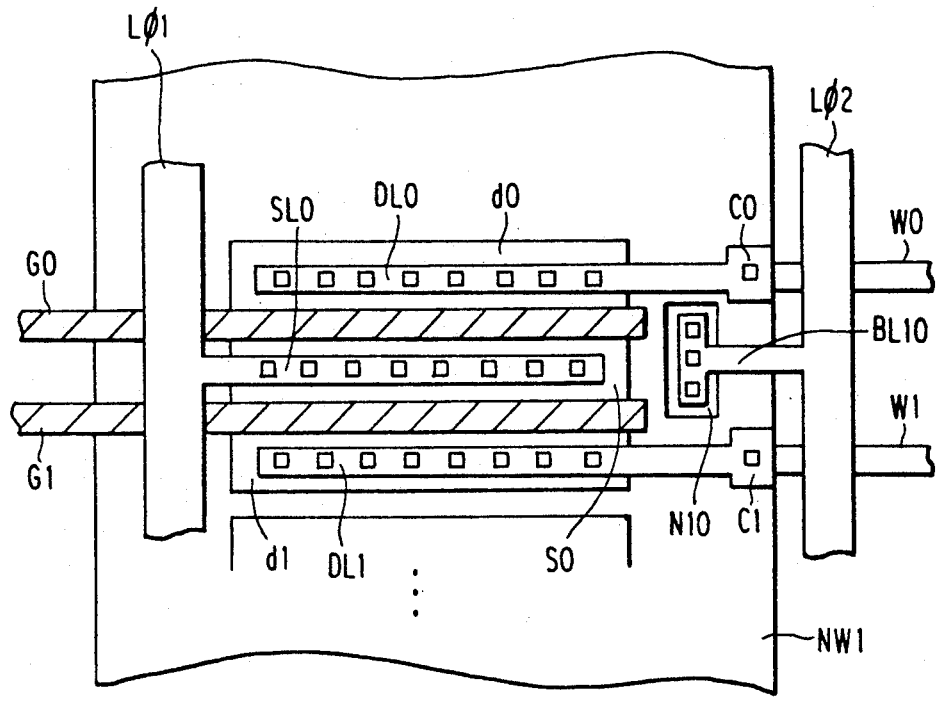
FIG. 6 is a plan view showing another wiring pattern of the portion of the decoder circuit shown in FIG. 3.

In the pattern shown in FIG. 6, the N+ type diffusion region N10 which is necessary to bias the N well with the biasing signal $\phi 2$, i.e., is connected through the contact hole to the aluminum wiring BL0, . . . to which the biasing signal $\phi 2$ is supplied is located not in parallel to the source-drain regions d0, s0, d1, s1, . . . of the word line drive transistors Q0, Q1, . . . but in the outside thereof. In the example shown in FIG. 4, the N+ type diffusion regions N0, N1, . . . are formed in the region in which the word line drive transistors are foemed and therefore an area of the word line drive transistor forming region is increased. Since, in the example shown in FIG. 6, the N+ type diffusion regions N10, . . . does not affect the area of the word line drive transistor forming region, it is possible to reduce the area correspondingly.

Figure 7:
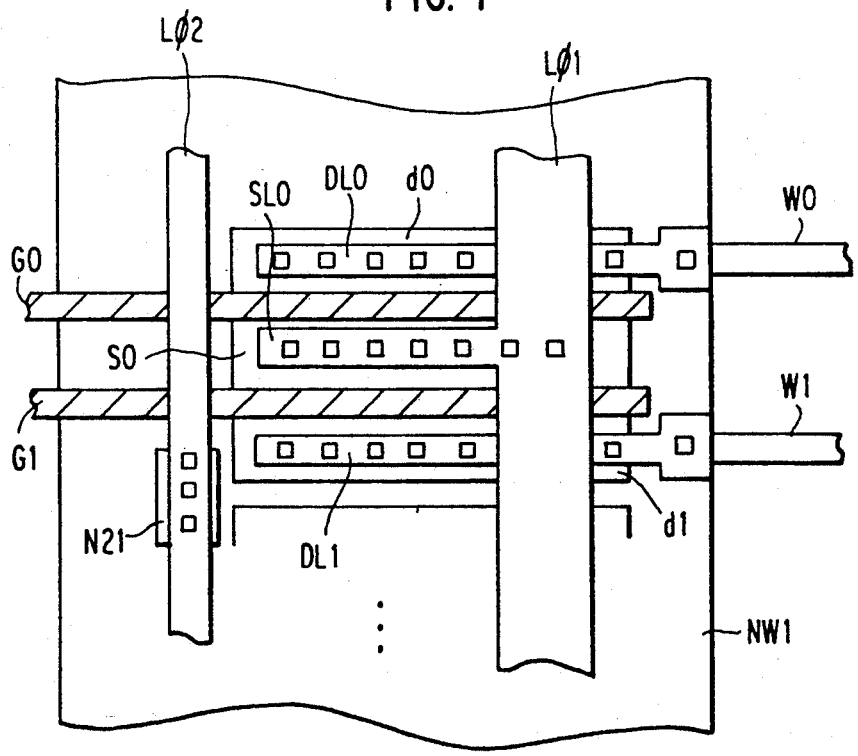
FIG. 7 is a plan view showing another wiring pattern of the portion of the decoder circuit shown in FIG. 3.

FIG. 7 shows an example of a pattern formed b a pair of aluminum wirings or a combination of an aluminum wiring and a silicide wiring, i.e., by the so-called multilayer wiring technique. In this example, a wiring L$\phi 1$ to which the clock signal $\phi 1$ for driving the word line and writing the memory cell is supplied is arranged above the word line drive transistor forming region by means of the multilayer wiring technique. With double layered aluminum wirings, for example, the wiring L$\phi 1$ is used as an upper second layer aluminum wiring, resulting in the shown wiring pattern. In this case, the biasing signal $\phi 2$ is connected from a first aluminum wiring L$\phi 2$ directly through contact hole to an N type diffusion layer N21 to bias an N type well to a high voltage.

When drain electrodes DL0, DL1, . . . are formed from not the aluminum wiring but the silicide wiring, it is possible to dispose the wiring L$\phi 1$ on the word line drive transistor forming region by using a single aluminum wiring layer.

It is further possible, as pattern formed by using the multilayered wiring technique, to form the wiring L$\phi 2$ to which the biasing signal $\phi 2$ is supplied on the word line drive transistor forming region with a similar wiring pattern of L$\phi 1$ shown in FIG. 7 or to form the wiring L$\phi 2$ by the silicide wiring.

A biasing signal generator circuit for generating the signal $\phi 2$ for biasing the N well to high voltage will be described. The signal $\phi 2$ is generated by a clock generator 15 as shown in FIG. 1. Since the clock generator 15 is a circuit for generating a plurality of clock signals ($\phi 0$, $\phi 1$, $\phi 2$, $\phi C0$, $\phi C1$, etc.), it is constituted with a plurality of clock generator circuits. The $\phi 2$ generator circuit is one of them.

Figure 8:
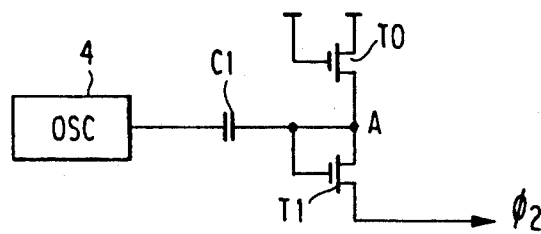
FIG. 8 is a circuit diagram showing an example of a high voltage biasing circuit.

Since the object of $\phi 2$ is to bias the N well to high voltage, it may be a high voltage d.c. signal. FIG. 8 shows an example of a high voltage generator circuit for producing such high voltage continuously. The circuit is the so-called charge-pump circuit constituted with an N type transistor T0 having drain and gate electrodes connected to a power source terminal (e.g., 5 V) and a source electrode connected to a junction A, an N channel transistor T1 having gate and drain electrodes connected to the junction A and a source electrode connected to a $\phi 2$ output, an oscillator 4 and a capacitor C1 having one electrode connected to an output of the oscillator 4 and the other electrode connected to the junction A. With this circuit and with power source of 5 V, the signal $\phi 2$ of about 7 V is always applied to the N well. Any other circuit than this can be used for the purpose so long as it produces a higher d.c. or continuous voltage than the power source voltage.

When such continuous high voltage generator circuit is used, power consumption may increase. In order to solve this problem, it is possible to use such clock signal as shown in FIG. 2e as the signal $\phi 2$ so that high voltage is applied only when it is necessary to bias the N well. In such case, the signal $\phi 2$ which is to prevent the clock signal $\phi 1$ from attributing to the biasing of the N well should become high level before the signal $\phi1$ becomes high level.

Figure 9:
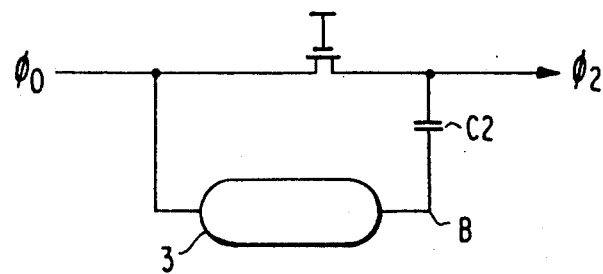
FIG. 9 is a circuit diagram showing another example of the high voltage biasing circuit.
Figure 10:
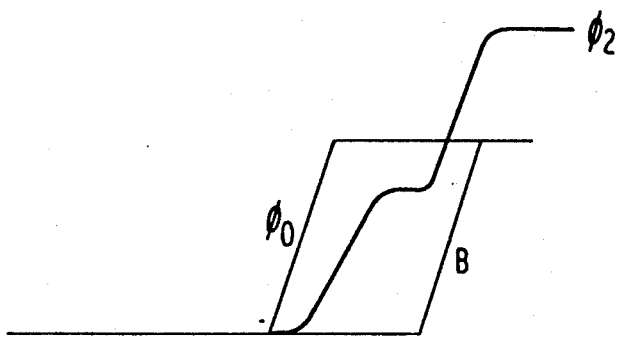
FIG. 10 is operating waveforms of the circuit shown in FIG. 9.

FIG. 9 shows an example of a high voltage clock signal generator circuit for producing such clock signal $\phi2$ as mentioned above. This circuit serves to charge a capacitor C2 by supplying a signal, e.g., $\phi0$, which becomes high level before the signal becomes high level to one end of the capacitor C2 and to drive B at the other end with the signal $\phi0$ delayed by a delay circuit 3. FIG. 10 shows a leading edge of the signal $\phi0$. As shown in FIG. 10, by applying the delayed signal to B, the charge voltage of the capacitor C2 is rised, so that a voltage (e.g., 7 V) higher than the power source voltage is supplied as the signal $\phi2$. With this circuit construction, it is possible to bias the N well to high voltage before the signal $\phi1$ becomes high level. The signal $\phi0$ is a mere example of the signal $\phi2$ and any other signal may be used therefor so long as it becomes high level precedingly to the signal $\phi1$. Circuit constructions for producing such signal can be easily realized by those skilled in the art. Further, this signal $\phi2$ which is to bias the N well to high voltage is not required to have an exactly controlled leading edge contrary to the signal $\phi1$. Therefore, there is a freedom in rise timing, causing a design of the circuit to be easier.

As described hereinbefore, according to the present invention, it is possible to constitute the word line drive transistors to be formed in the N well with P channel transistors having no problem of breakdown of gate insulating film due to application of high voltage by supplying the biasing signal $\phi2$ separately from the clock signal $\phi1$ for writing. Further, since there is no extra load is applied to the clock signal $\phi1$, it is possible to increase the driving speed of the word lines.

Although in the described embodiments the semiconductor memory device is formed on the P type substrate on which a single N well is formed, the present invention is not limited thereto and is also applicable to a construction where a plurality of N wells are formed on the P type substrate, provided that such biasing signal as mentioned hereinbefore is applied to each of the N wells. Further, the present invention is also applicable to a construction using an N type substrate. On the N type substrate, a P type well is formed in which a semiconductor memory device and an N well are formed to form the so-called double well structure and word line drive transistors may be formed in the N well. In this case, the P type well corresponds to the described P type substrate.

The present invention is applicable to a decoder circuit for not only DRAM but also SRAM (static RAM), PROM (programmable read only memory), EPROM (erasable PROM), EEPROM (slectrically erasable PROM), etc.

Although the present invention has been described is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A decoder circuit comprising a first conductivity type substrate, a second conductivity type well region formed in said substrate, a plurality of word line drive transistors formed in said well region, each of said word line drive transistors having a gate supplied with a selection signal assuming one of a selection level and non-selection level and a source-drain path connected between a word line and an input terminal supplied with a word line drive signal for driving said word line, said word line drive signal changing between an active level and an inactive level, and means for biasing said well region with a biasing signal different from said word line drive signal.

2. The decoder circuit as claimed in claim 1, wherein said biasing signal is higher in voltage than said selection signal.

3. The decoder circuit as claimed in claim 1, wherein said selection signal is produced by a logic circuit, said logic circuit responding to a set of address signals to control the level of said selection signal.

4. The decoder circuit as claimed in claim 1, wherein said word line drive transistors formed in said well region are equal in number to said word lines.

5. The decoder circuit as claimed in claim 1, wherein said biasing signal is a d.c. signal.

6. The decoder circuit as claimed in claim 1, wherein said word lines are for a DRAM.

7. The decoder circuit as claimed in claim 1, wherein said word lines are for an SRAM.

8. The decoder circuit as claimed in claim 1, wherein said word lines are for an EPROM.

9. The decoder circuit as claimed in claim 1, wherein said word lines are for an EEPROM.

10. A decoder circuit comprising a first conductivity type substrate, a second conductivity type well region formed in said substrate, a plurality of word line drive transistors formed in said well region, each of said word line drive transistors having a gate supplied with a selection signal assuming one of a selection level and a non-selection level and a source-drain path connected between a word line and an input terminal supplied with a word line drive signal for driving said word line, and means for biasing said well region with a biasing signal different from the word line drive signal, said biasing signal being produced by a high voltage generator circuit comprising a charge-pump circuit.

11. A decoder circuit comprising a first conductivity type substrate, a second conductivity type well region formed in said substrate, a plurality of word line drive transistors formed in said well region, each of said word line drive transistors having a gate supplied with a selection signal assuming one of a selection level and a non-selection level and a source-drain path connected between a word line and an input terminal supplied with a word line drive signal for driving said word line, and means for biasing said well region with a biasing signal different from said word line drive signal, said biasing signal being a clock signal whose level becomes high before said word line drive signal becomes high level.

12. A decoder circuit comprising a first conductivity type substrate, a second conductivity type well region formed in said substrate, a plurality of word line drive transistors formed in said well region, each of said word line drive transistors having a gate supplied with a selection signal assuming one of a selection level and a non-selection level and a source-drain path connected between a word line and an input terminal supplied with a word line drive signal for driving said word line, and means for biasing said well region with a biasing signal different from said word line drive signal, said biasing signal being produced by a circuit for producing a high voltage signal on the basis of an internal clock signal whose level becomes high before said word line drive signal becomes high level.

13. A decoder circuit for a semiconductor memory having a plurality of word lines, comprising a first terminal, a second terminal, a first generator circuit generating a word line drive signal and supplying said word line drive signal to said first terminal, said word line drive signal changing between an active level and an inactive level, a second generator circuit generating a biasing signal separately from said word line drive signal and supplying said biasing signal to said second terminal, a plurality of P-channel MOS transistors each having a front gate, a back gate connected to said second terminal and a source-drain path connected between an associated one of said word lines and said first terminal, and a decoder responding to a set of address signals and supplying a selection level to the front gate of one of said P-channel MOS transistor to render said one P-channel MOS transistor conductive and a non-selection level to the front gates of remaining ones of said P-channel MOS transistors to render said remaining P-channel MOS transistors nonconductive.

14. The decoder circuit as claimed in claim 13, wherein said biasing signal has a voltage amplitude larger than a voltage difference between said selection level and said non-selection level.

15. The decoder circuit as claimed in claim 14, wherein a voltage difference between said active level and said inactive level of said word line drive signal is substantially equal to said voltage amplitude of said biasing signal.

16. A decoder circuit for a semiconductor memory having a plurality of word lines, comprising a first terminal, a second terminal, a first circuit supplying said first terminal with a word line drive signal changing between an active level and an inactive level, a second circuit for supplying said second terminal with a biasing signal separately from said word line drive signal, a plurality of MOS transistors each having a front gate, a back gate connected to said second terminal and a source-drain path connected between an associated one of said word lines and said first terminal, and a decoder responding to a set of address signals and supplying a selection level to the front gate of one of said MOS transistors and a non-selection level to the front gates of remaining ones of said MOS transistors, said selection level being substantially equal to said inactive level of said word line drive signal, said one MOS transistor being turned on while said first terminal is supplied with said active level of said word line drive signal to transfer said active level to the associated one of said word line.

17. The decoder circuit as claimed in claim 16, wherein said active level of said word line drive signal is larger than said non-selection level and said biasing signal has a level substantially equal to said active level of said word line drive signal.

18. The decoder circuit as claimed in claim 17, wherein said selection level is supplied to the front gate of said one MOS transistor before said word line drive signal changes from said inactive level to said active level.

19. The decoder circuit as claimed in claim 16, wherein said biasing signal changes between a non-bias level and a bias level, said non-bias level being substantially equal to said inactive level of said word line drive signal, and said biasing signal changing from said non-bias level to said bias level before said word line drive signal changes from said inactive level to said active level.

20. The decoder circuit as claimed in claim 19, wherein said selection level is supplied to the front gate of said one MOS transistor before said biasing signal changes from said non-bias level to said bias level.

21. The decoder circuit as claimed in claim 19, wherein said active level and said bias level are larger than said non-selection level.

* * * * *